US009660733B2

United States Patent
Sato et al.

(10) Patent No.: US 9,660,733 B2
(45) Date of Patent: May 23, 2017

(54) SIGNAL PROCESSING APPARATUS, SIGNAL PROCESSING METHOD, AND SIGNAL PROCESSING SYSTEM

(71) Applicant: FUJITSU LIMITED, Kawasaki-shi, Kanagawa (JP)

(72) Inventors: Masashi Sato, Kawasaki (JP); Kazuhiko Hatae, Kawasaki (JP); Tomoki Katou, Kawasaki (JP); Nobukazu Koizumi, Kawasaki (JP); Masato Oota, Atsugi (JP); Yasuo Ohtomo, Yokohama (JP); Manabu Yamazaki, Fuchu (JP); Daisuke Sasaki, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 134 days.

(21) Appl. No.: 14/841,834

(22) Filed: Sep. 1, 2015

(65) Prior Publication Data

US 2016/0134261 A1 May 12, 2016

(30) Foreign Application Priority Data

Nov. 10, 2014 (JP) ................................. 2014-228299

(51) Int. Cl.
| | |
|---|---|
| *H04B 10/61* | (2013.01) |
| *H03H 21/00* | (2006.01) |
| *H03H 17/02* | (2006.01) |

(52) U.S. Cl.
CPC ....... *H04B 10/616* (2013.01); *H03H 21/0012* (2013.01); *H04B 10/612* (2013.01); *H03H 17/0294* (2013.01)

(58) Field of Classification Search
CPC .......... H03H 21/0012; H03H 21/0029; H03H 21/0043
See application file for complete search history.

(56) References Cited

U.S. PATENT DOCUMENTS

| | | | | |
|---|---|---|---|---|
| 4,472,733 A | * | 9/1984 | Bolger | H04N 9/646 348/438.1 |
| 5,781,463 A | * | 7/1998 | Ogawa | H03H 21/0012 708/322 |
| 6,052,413 A | * | 4/2000 | Fukuoka | H03H 21/0012 375/235 |
| 2003/0063664 A1 | * | 4/2003 | Bodenschatz | H03H 21/0012 375/232 |

(Continued)

FOREIGN PATENT DOCUMENTS

| | | |
|---|---|---|
| JP | 2004-22041 | 1/2004 |
| WO | 2009/028349 | 3/2009 |

*Primary Examiner* — Chuong D Ngo

(74) *Attorney, Agent, or Firm* — Fujitsu Patent Center

(57) ABSTRACT

A signal processing apparatus includes: a filter; and a filter control circuit, wherein the filter control circuit is configured to: detect a power of signals output from the filter; determine one of a plurality of numerical ranges to which the power belongs; update a filter coefficient of the filter according to a determination result; count a number of the signals having the power of a first value or more; set an invalid area which becomes a target not to be determined for each of one or more boundaries between the plurality of numerical ranges when the number of the signals becomes a second value or more; and control a width of the invalid area based on the number of signals.

18 Claims, 16 Drawing Sheets

(56) References Cited

U.S. PATENT DOCUMENTS

| | | | |
|---|---|---|---|
| 2005/0271135 A1* | 12/2005 | Shida | H03H 21/0012 |
| | | | 375/232 |
| 2008/0123788 A1* | 5/2008 | Wongwirawat | H03G 3/3052 |
| | | | 375/348 |
| 2010/0223311 A1 | 9/2010 | Sugiyama | |
| 2015/0358189 A1* | 12/2015 | Doi | H04L 27/2614 |
| | | | 375/297 |

* cited by examiner

FIG. 16

|  | OSNR16 | OSNR18 | OSNR20 | OSNR22 |
|---|---|---|---|---|
| GUARD BAND IS ABSENT | 3.14 | 5.447 | 7.483 | 9.387 |
| GUARD BAND CONTROL IS ABSENT | 3.273 | 5.518 | 7.549 | 9.387 |
| GUARD BAND CONTROL IS PRESENT | 3.352 | 5.518 | 7.561 | 9.387 |

(UNIT : dB)

US 9,660,733 B2

SIGNAL PROCESSING APPARATUS, SIGNAL PROCESSING METHOD, AND SIGNAL PROCESSING SYSTEM

CROSS-REFERENCE TO RELATED APPLICATION

This application is based upon and claims the benefit of priority from the prior Japanese Patent Application No. 2014-228299, filed on Nov. 10, 2014, the entire contents of which are incorporated herein by reference.

FIELD

The embodiments discussed herein are related to a signal processing apparatus, a signal processing method, and a signal processing system.

BACKGROUND

An adaptive equalizer (AEQ) used for various signal processing has been known. The adaptive equalizer is installed in, for example, a transmission apparatus of a digital coherent optical transmission scheme.

Related techniques are disclosed in, for example, Japanese Laid-Open Patent Publication No. 2004-22041 and International Publication Pamphlet No. WO 2009/028349.

SUMMARY

According to one aspect of the embodiments, a signal processing apparatus includes: a filter; and a filter control circuit, wherein the filter control circuit is configured to: detect a power of signals output from the filter; determine one of a plurality of numerical ranges to which the power belongs; update a filter coefficient of the filter according to a determination result; count a number of the signals having the power of a first value or more; set an invalid area which becomes a target not to be determined for each of one or more boundaries between the plurality of numerical ranges when the number of the signals becomes a second value or more; and control a width of the invalid area based on the number of signals.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 16 illustrates an example of the Q value.

DESCRIPTION OF EMBODIMENTS

In a digital coherent optical transmission scheme, the symbols defined by a phase and amplitude of a signal are transmitted by a multi-value digital modulation scheme such as, for example, 16 QAM (Quadrature Amplitude Modulation). Accordingly, in a transmission apparatus of a reception side, the powers calculated from the amplitudes of signals are classified into a plurality of numerical ranges and a tap coefficient of a finite impulse response (FIR) filter is updated according to the determination result of the numerical range to which the power of a received signal belongs.

For example, since the power variation of the signal is increased when a noise is large, the boundaries between the numerical ranges may become unclear and erroneous determinations on the numerical ranges may be increased. For this reason, the transmission apparatus of the reception side t sets invalid areas in, for example, the boundaries between the numerical ranges in advance and handles the signals having the power belonging to the invalid areas as targets not to be determined. As a result, since the number of signals used for updating the tap coefficient is decreased, the calculation accuracy of the tap coefficient may be reduced such that the performance of the FIR filter may be deteriorated.

Figure 1:
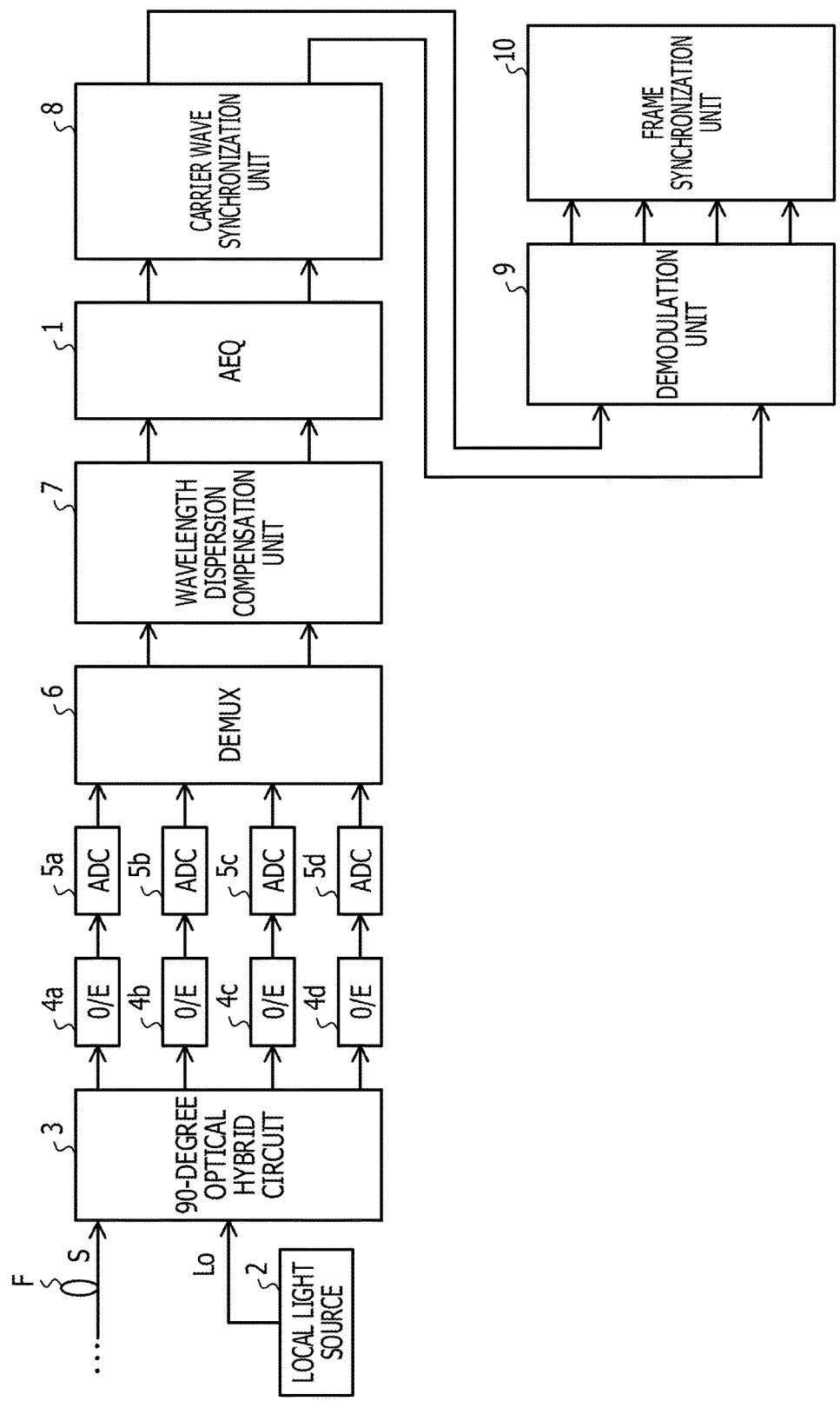
FIG. 1 illustrates an example of a reception apparatus of a digital coherent optical transmission scheme.

FIG. 1 illustrates an example of a reception apparatus of a digital coherent optical transmission scheme. The reception apparatus includes an adaptive equalizer (AEQ) 1, which is an example of a signal processing apparatus, a local light source 2, a 90-degree optical hybrid circuit 3, optical-to-electrical converters (O/Es) 4a to 4d, and analog-digital converters (ADCs) 5a to 5d. The reception apparatus includes a demultiplexer (DEMUX) 6, a wavelength dispersion compensation unit 7, a carrier wave synchronization unit 8, a demodulation unit 9, and a frame synchronization unit 10.

At least a portion of each of the units described above may include, for example, a DSP (Digital Signal Processor). The transmission scheme applied to the reception apparatus may be a digital coherent optical transmission scheme but other transmission scheme may be adapted as well.

The local light source 2 inputs a local light Lo synchronized with an output light of a transmission apparatus to the 90-degree optical hybrid circuit 3. The 90-degree optical hybrid circuit 3 separates an optical signal S input from the transmission apparatus through a transmission line F and the local light Lo input from the local light source 2 into H axis and V axis (polarization axes) by, for example, a polarizing beam splitter. For example, an optical fiber, an optical waveguide formed in a free space or a semiconductor substrate, and an optical element used in an optical transceiver or optical repeater may be used as a transmission line F.

The 90-degree optical hybrid circuit 3 includes a waveguide used to make the local light component to interfere with the light component of signals of the H axis and V axis and detects the light components of signals of the H axis and V axis. The 90-degree optical hybrid circuit 3 outputs the light components according to the amplitude and phase of each of I channel and Q channel to each of the O/Es 4a to 4d.

The O/Es 4a to 4d convert the input light components of signals into electrical signals and output the electrical signals into the ADCs 5a to 5d, respectively. For example, photo detectors are used as the O/Es 4a to 4d.

The ADCs 5a to 5d each samples an electrical signal input from each of the O/Es 4a to 4d with a clock signal so as to convert the electrical signal into a digital signal. The digital signal is input to the DEMUX 6.

The DEMUX 6 develops signal components of I channel and Q channel in parallel in order to process signals in parallel in a plurality of circuits located in a post-stage. Each of the DEMUX 6 and circuits located in the post-stage thereof is provided with a circuit having a plurality of lanes in order to develop the signal components of the I channel and Q channel in parallel or process the signals developed in parallel.

The wavelength dispersion compensation unit 7 compensates a waveform distortion of the signal generated by the wavelength dispersion within the transmission line F. The AEQ 1 includes a plurality of filter circuits, and adaptively changes the filter coefficient related to the characteristic of a filter circuit according to the characteristic of the digital signal so as to compensate the waveform distortion of the signal.

The carrier wave synchronization unit 8 corrects differences in a frequency and phase between a light source of the transmission apparatus and the local light source 2 such that the signal is normally demodulated by a signal constellation (signal spatial diagram) according to the modulation scheme of the transmission apparatus. The signal constellation is a diagram representing signal points according to an amplitude and phase of signal on a complex plane having the real axis I and imaginary axis Q.

The carrier wave synchronization unit 8 corrects the frequency difference and phase difference of carrier waves of signals by estimation and then outputs the signal subjected to the correction processing to the demodulation unit 9. The demodulation unit 9 recognizes the signal points based on the signal constellation according to the modulation scheme to demodulate the digital signal. The frame synchronization unit 10 aligns the demodulated signal into a frame having a certain frame format.

Figure 2:
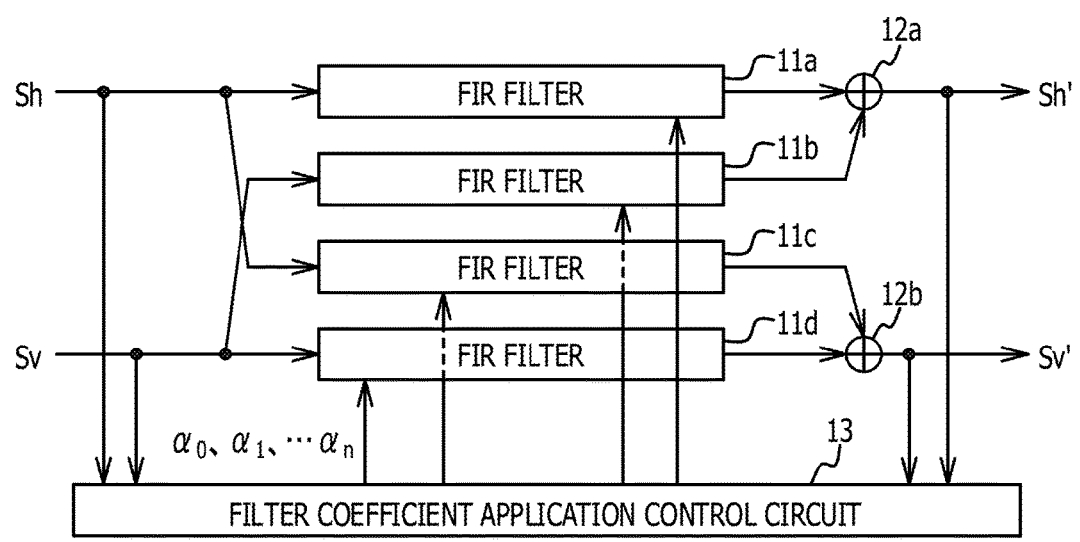
FIG. 2 illustrates an example of an adaptive equalizer (AEQ)

FIG. 2 illustrates an example of an adaptive equalizer (AEQ). The AEQ 1 includes a plurality of FIR filters 11a to 11d, a plurality of adders 12a, 12b, and a filter coefficient application control circuit 13.

The FIR filters 11a to 11d include a butterfly FIR filter unit, and perform filtering on each of signals Sh and Sv of the H axis and V axis input from the wavelength dispersion compensation unit 7 located in a pre-stage. The components of I channel and Q channel are included in each of the signals Sh and Sv of the H axis and V axis.

The FIR filters 11a to 11d estimate the characteristic of the transmission line F, and multiply the signals Sh and Sv by a tap coefficient in which an inverse characteristic compensating the characteristic of the transmission line F is reflected to correct the signals Sh and Sv. The FIR filters 11a to 11d may be used as filters and otherwise, other filters such as IIR (Infinite Impulse Response) filters may be used instead.

The signal Sh is input to the FIR filters 11a and 11c and the signal Sv is input to the FIR filters 11b and 11d. The FIR filter 11c generates a leakage component of the signal Sh mixed to the signal Sv and the FIR filter 11b generates a leakage component of the signal Sv mixed to the signal Sh.

The adder 12a adds the outputs of the FIR filters 11a and 11b with each other and the adder 12b adds the outputs of the FIR filters 11c and 11d with each other. Accordingly, the leakage component of the signal Sv is removed from the filtered signal Sh and the leakage component of the signal Sh is removed from the filtered signal Sv. The adders 12a and 12b output the signals Sh' and Sv' after correction to the carrier wave synchronization unit 8 of the post-stage.

Figure 3:
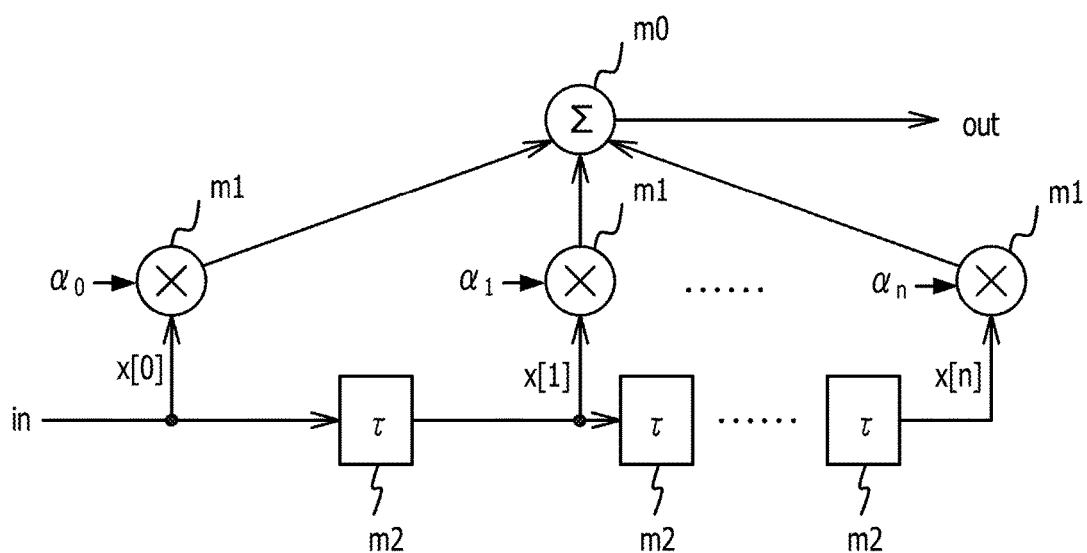
FIG. 3 illustrates an example of an FIR filter.

FIG. 3 illustrates an example of an FIR filter. Each of the FIR filters 11a to 11d illustrated in FIG. 3 includes a plurality of delay units m2, a plurality (the number of taps) of multipliers m1, and an adder m0.

Each of the FIR filters 11a to 11d sequentially delays the signal x[0] (Sh, Sv) input from an input terminal "in" by the plurality of delay units m2 to generate signals x[1] to x[n] (n is a positive integer). In the FIR filters 11a to 11d, the signals x[0] to x[n] are multiplied by the tap coefficients $\alpha 0$ to $\alpha n$ by the multipliers m1, respectively, and the output values from the multipliers m1 are added in the adder m0 and the total added output values are output from an output terminal "out". The tap coefficients $\alpha 0$ to $\alpha n$ may be the example of filter coefficients.

The filter coefficient application control circuit 13 illustrated in FIG. 2 updates the tap coefficients $\alpha 0$ to $\alpha n$ of the FIR filters 11a to 11d so as to follow the variation of characteristics of the transmission line F. The signals Sh and Sv before correction and the signals Sh' and Sv' after correction are input into the filter coefficient application control circuit 13.

Figure 4:
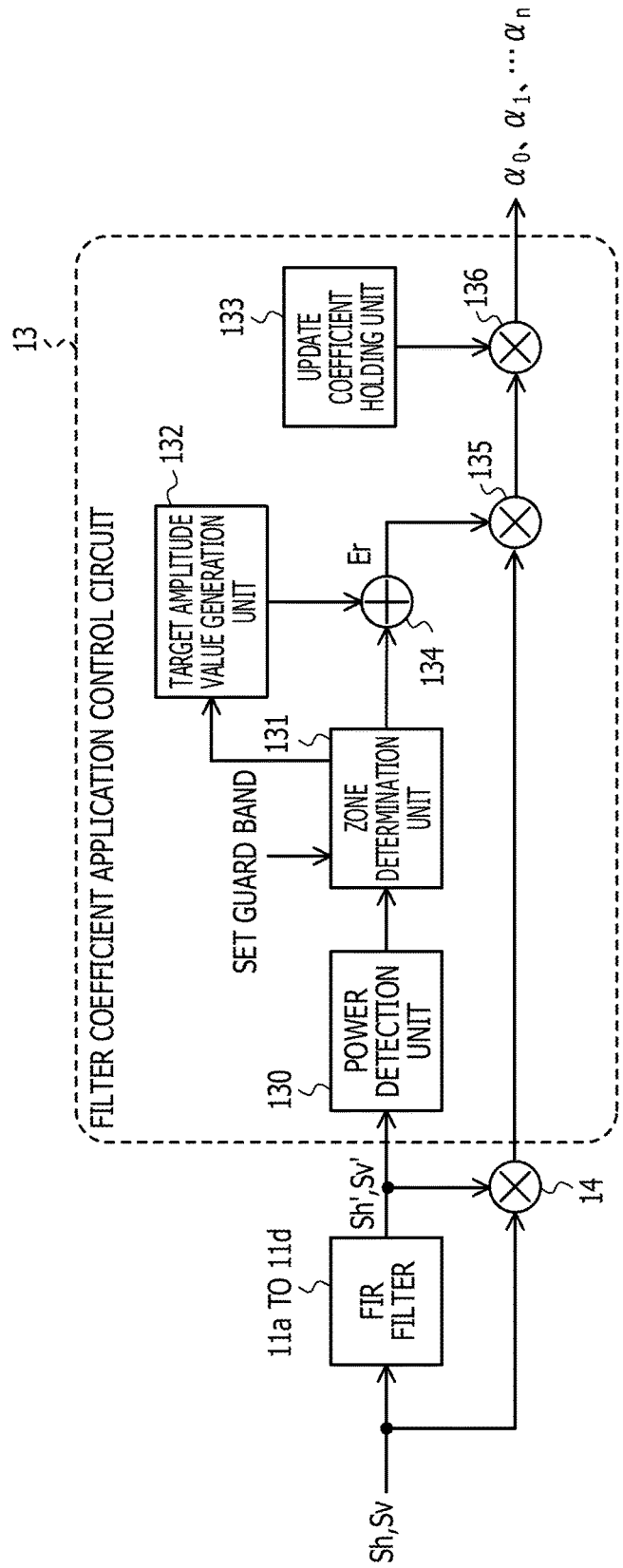
FIG. 4 illustrates an example of a filter coefficient application control circuit.

FIG. 4 illustrates an example of a filter coefficient application control circuit. The filter coefficient application control circuit 13 includes a power detection unit 130, a zone determination unit 131, a target amplitude value generation unit 132, an adder 134, multipliers 135, 136, and an update coefficient holding unit 133. The tap coefficients before update, for example, the current tap coefficients $\alpha 0$ to $\alpha n$ obtained by multiplying the signals Sh and Sv before correction with the signals Sh' and Sv' after correction by the multiplier 14 are input into the filter coefficient application control circuit 13. The configuration illustrated in FIG. 4 may be installed in each of the FIR filters 11a to 11d.

The power detection unit 130 detects the power of the signals Sh' and Sv' output from the FIR filters 11a to 11d. For example, the power detection unit 130 calculates power values from the amplitude of the signals Sh' and Sv'. The power detection unit 130 outputs the power value of the signals Sh' and Sv' to the zone determination unit 131.

The zone determination unit 131 determines one of the plurality of numerical ranges to which the power detected by the power detection unit 130 belongs. For example, the zone determination unit 131 determines a zone prescribed for each numerical range. The zone is classified by the amplitude value of the signals Sh' and Sv'.

Figure 5A:
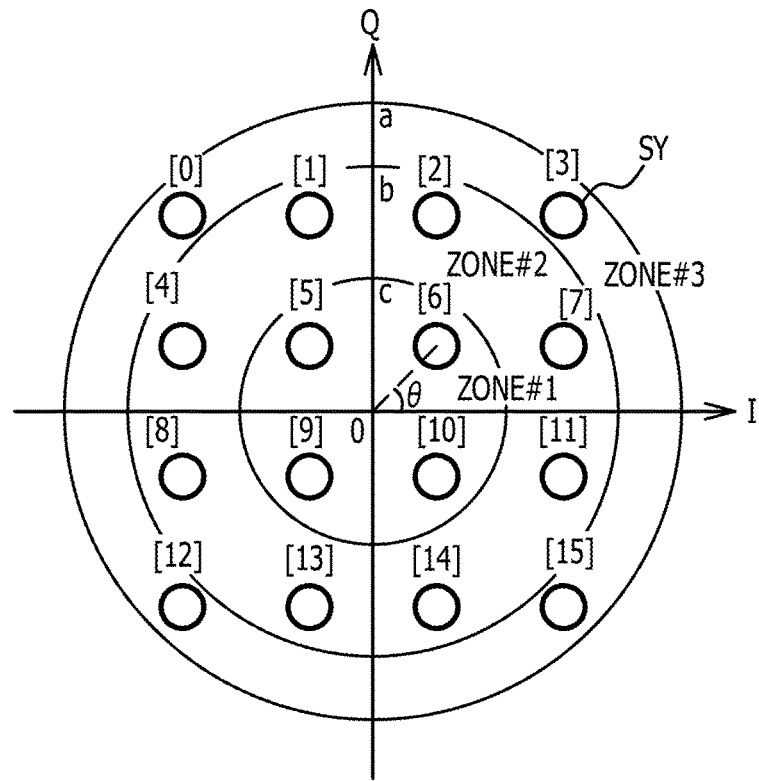
FIG. 5A and FIG. 5B each illustrates an example of a signal constellation.
Figure 5B:
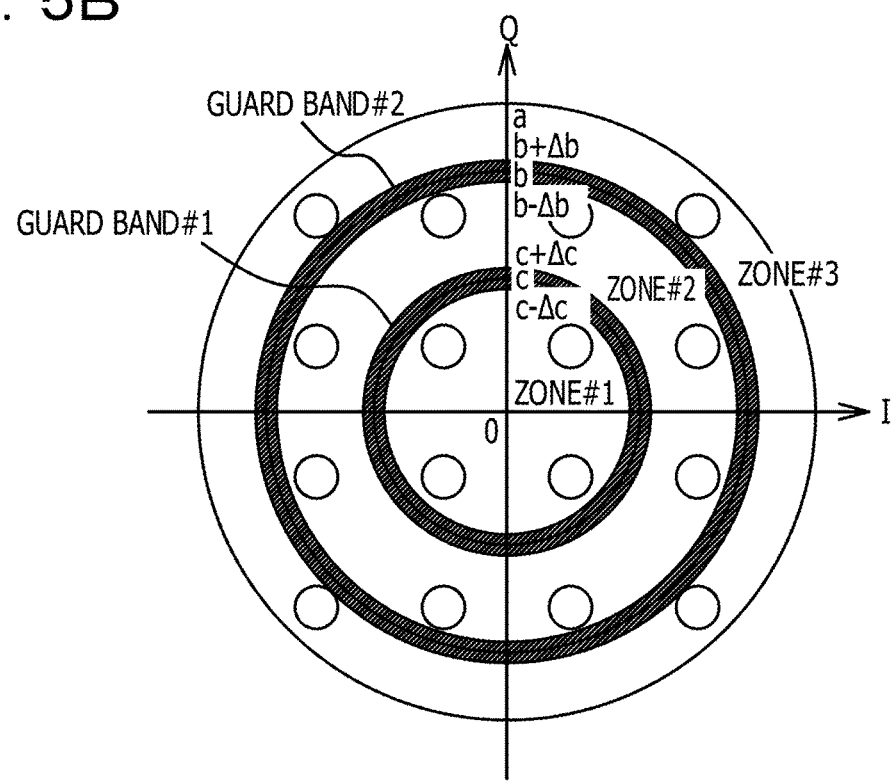

FIG. 5A and FIG. 5B each illustrates an example of a signal constellation. In FIG. 5A, zones on the signal constellation are represented when the guard band is not set. For example, the signal constellation for a case where a modulation scheme of the transmission apparatus is 16 QAM is represented.

The values "0" to "15" of a symbol SY are determined according to the amplitude value and phase of the signals Sh' and Sv'. The amplitude value is indicated by a distance from a center O of the I-Q plane to the symbol SY and the phase is indicated by an angle θ of a line segment joining the center O and the symbol SY with respect to an I-axis orientation.

When the amplitude value is set as A, the zone #1 is defined in a numerical range of 0<A≤c and the zone #2 is defined in a numerical range of c<A≤b. The zone #3 is defined in a numerical range of b<A≤a. Since the power of the signals Sh' and Sv' is calculated from the amplitude value, the zone determination unit 131 determines the zone based on the power of the signals Sh' and Sv'.

Figure 6A:
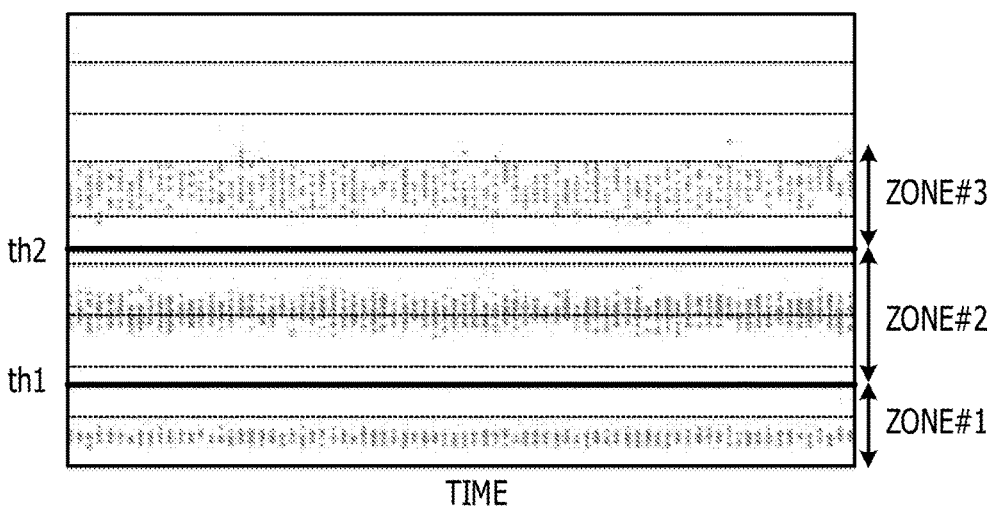
FIG. 6A and FIG. 6B each illustrates an example of a signal power distribution.
Figure 6B:
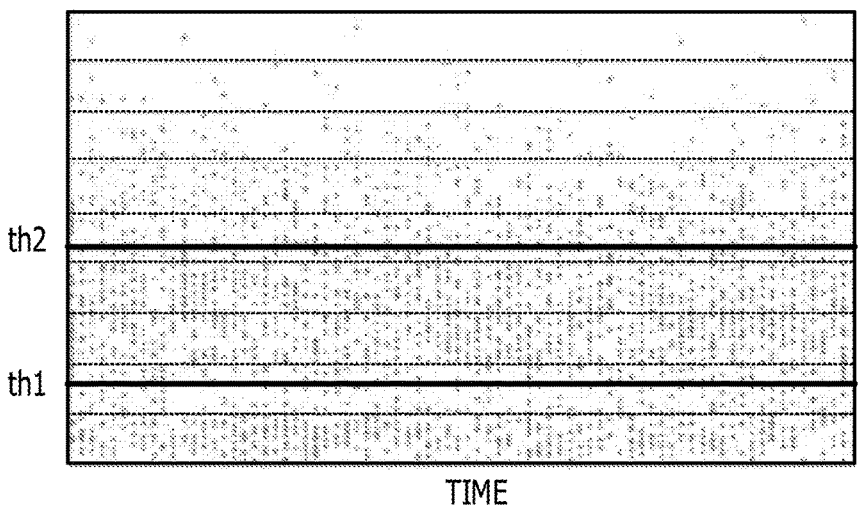

FIG. 6A and FIG. 6B each illustrates an example of a power distribution of signals. In FIG. 6A, the power distribution of the signals Sh' and Sv' to time for a case where noise is small is represented. In FIG. 6A, the horizontal axis represents the time and the vertical axis represents the power of signals Sh' and Sv'. The points within the graph indicate individual signals Sh' and Sv' constituted by the units of symbol obtained by being modulated in the transmission apparatus.

The powers of the signals Sh' and Sv' are classified into zones #1, #2, and #3 by certain threshold values th1 and th2. The threshold value th1 is set in a boundary between the numerical ranges of the zones #1 and #2 and the threshold value th2 is set in a boundary between the numerical ranges of the zones #2 and #3. The zone #3 has the highest power and the zone #1 has the lowest power.

In a case where noise is small, since the variation of the signals Sh' and Sv' is small, the boundaries between the zones #1, #2 and #3 are clear. Accordingly, the zone determination unit 131 indicated in FIG. 4 determines the zones #1, #2 and #3 with high accuracy using the threshold values th1 and th2. The zone determination unit 131 notifies the target amplitude value generation unit 132 of the determination results of the zones #1, #2 and #3.

The target amplitude value generation unit 132 uses an object function to generate a target value of the amplitude value of the signals Sh' and Sv' according to the determination results of the zones. The generated target values are output to the adder 134. The adder 134 calculates an error Er between the amplitude value of the signals Sh' and Sv' output from the zone determination unit 131 and the target value, and outputs the error Er to the multiplier 135. The multiplier 135 multiplies the current tap coefficients α0 to αn input from the pre-stage multiplier 14 by the error Er and outputs the multiplication result to the multiplier 136 of the post-stage.

The multiplier 136 multiplies the tap coefficients α0 to αn output from the multiplier 135 of the pre-stage by an update coefficient maintained in the update coefficient holding unit 133 and outputs the multiplication result to the FIR filters 11a to 11d. The update coefficient is a parameter indicating what extent the tap coefficients α0 to αn are changed in a certain unit of time in updating of the tap coefficients α0 to αf. For example, the update coefficient may be sensitivity for the update, and indicates a variation amount indicating whether the tap coefficients α0 to αn are to be gradually varied or rapidly varied.

By doing this, the tap coefficients α0 to αn of the FIR filters 11a to 11d are updated so as to follow the variation of the characteristic of the transmission line F for the signals Sh' and Sv'.

In a case where the noise is large, the power variation of the signals Sh' and Sv' is increased as illustrated in FIG. 6B. Accordingly, since the boundaries between the zones #1, #2, and #3 become unclear and it becomes difficult to accurately determine the zones to which the signals Sh' and Sv' in the vicinity of the boundaries belong according to the threshold values th1 and th2, the erroneous determination for the zones #1, #2, and #3 by the zone determination unit 131 are increased. Accordingly, the calculation accuracy of the tap coefficients α0 to αn is decreased.

For example, as illustrated in FIG. 4, guard bands are set for the zone determination unit 131 by an external apparatus such as a network management apparatus. The guard bands are set in the boundaries between the zones #1, #2, and #3, and the guard bands may be an example of an invalid area regarded as a target not to be determined by the zone determination unit 131.

In FIG. 5B, the zones #1, #2, and #3 on the signal constellation when the guard bands are set are represented. A guard band #1 is set in the boundary between the zones #1 and #2 and includes a numerical range of c−Δc<A≤c+Δc. A guard band #2 is set in the boundary between the zones #2 and #3 and includes a numerical range of b−Δb<A≤b+Δb. The Δb and Δc that respectively prescribe the widths of the guard bands #2 and #1 may be prescribed as, as one example, a ratio (%) of the boundary value b of the zones #2 and #3 and the boundary value c of the zones #1 and #2, respectively.

Figure 7:
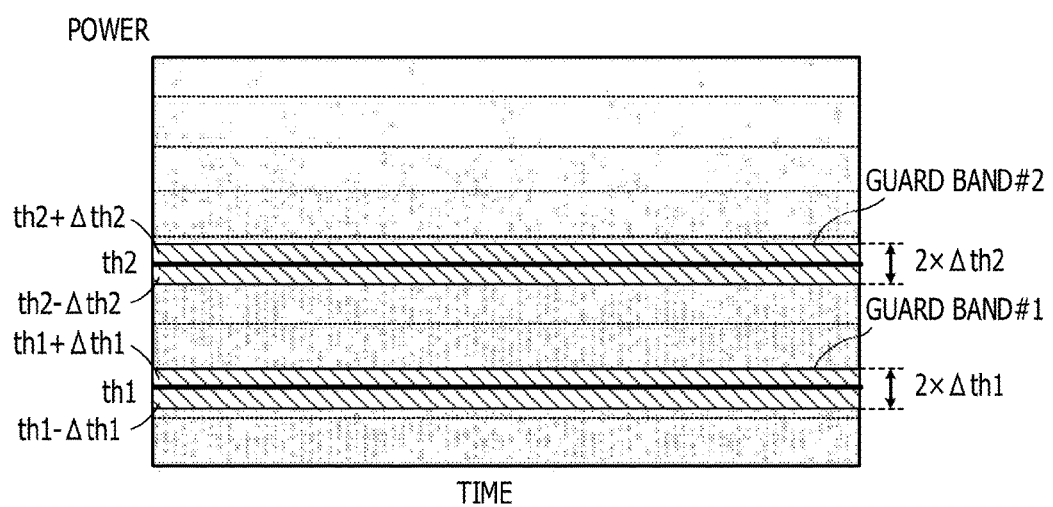
FIG. 7 illustrates another example of a signal power distribution.

FIG. 7 illustrates another example of a signal power distribution. In FIG. 7, the power distribution of the signals Sh' and Sv' to time for a case where the guard bands #1 and #2 are set is represented. When the power of the signals Sh' and Sv' is set as P, the numerical range of the guard band #1 is th1−Δth1<P≤th1+Δth1, and the numerical range of the guard band #2 is th2−Δth2<P≤th2+Δth2. Therefore, the widths of the guard bands #1 and #2 become 2×Δth1 and 2×Δth2, respectively. The Δth1 and Δth2 may be determined according to the Δb and Δc, respectively.

The zone determination unit 131 handles the signals Sh' and Sv' of which the power belongs to the numerical ranges of the guard bands #1 and #2 as targets not to be determined. For example, the signals Sh' and Sv' of which the power belongs to the numerical ranges of the guard bands #1 and #2 may not be used for calculating the tap coefficient α0 to αn. Therefore, the erroneous determination by the zone determination unit 131 may be reduced.

The guard bands #1 and #2 may not be changed during communication once the guard bands #1 and #2 are set. Accordingly, the number of signals used for calculating the tap coefficient α0 to αn is decreased as the number of signals Sh' and Sv' within the guard bands #1 and #2 is increased, and the update coefficient becomes smaller in appearance. As a result, the calculation accuracy of the tap coefficients α0 to αn is reduced and thus, the performance of the FIR filters 11a to 11d may be deteriorated.

When the number of signals having the power of a certain value or more becomes a certain number or more, the AEQ 1 sets the guard bands #1 and #2 in the boundaries between the zones #1, #2, and #3. The widths of the guard bands #1 and #2 are controlled based on the number of signals such that the filter performance may be improved.

Figure 8:
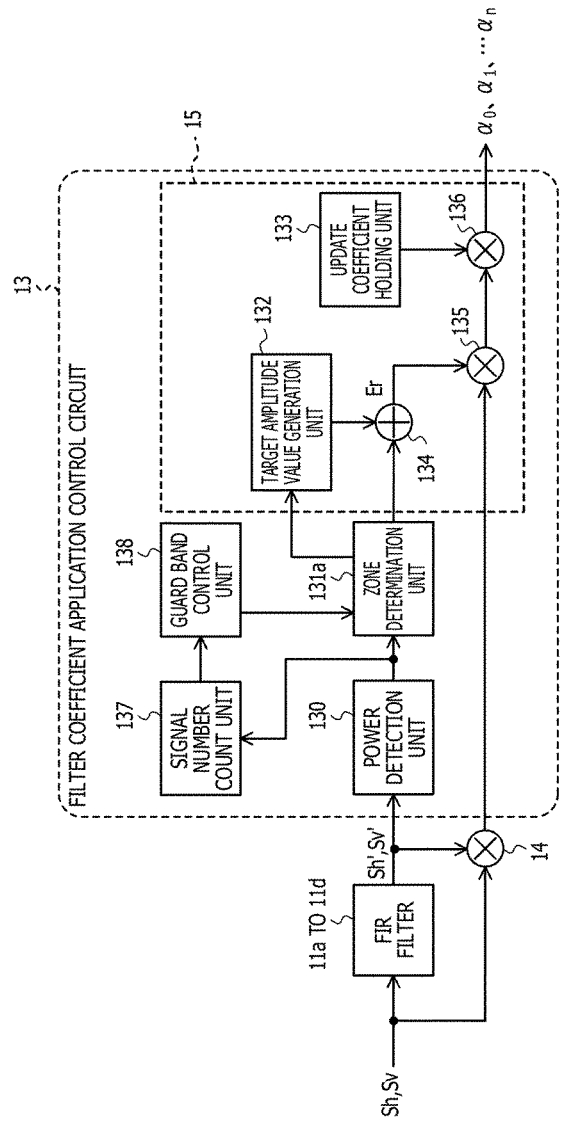
FIG. 8 illustrates an example of a filter coefficient application control circuit.

FIG. 8 illustrates an example of a filter coefficient application control circuit. In FIG. 8, same reference numerals are given to the configuration which is substantially the same as or similar to that illustrated in FIG. 4, and descriptions thereof may be omitted or reduced.

The filter coefficient application control circuit 13 includes the power detection unit 130, a zone determination unit 131a, the target amplitude value generation unit 132, the adder 134, the multipliers 135, 136, the update coefficient holding unit 133, a signal number count unit 137, and a guard band control unit 138. The filter coefficient application control circuit 13 may be a processor. The functions of each unit of the processor may be executed by executing a program stored in, for example, a memory by the processor.

The power detection unit 130 outputs the power value of the signals Sh' and Sv' to the zone determination unit 131a and the signal number count unit 137. The zone determination unit 131a determines the zones #1, #2, and #3 to which the power detected by the power detection unit 130 belongs. The target amplitude value generation unit 132, the adder 134, the multipliers 135, 136, and the update coefficient holding unit 133 are included in an update unit 15, and the update unit 15 updates the tap coefficients α0 to αn of the FIR filters 11a to 11d according to the determination result by the zone determination unit 131a.

The signal number count unit 137 counts the number of signals Sh' and Sv' having the power detected by the power detection unit 130 of a certain value or more. The signal number count unit 137 outputs the counted number of signals to the guard band control unit 138.

When the number of signals counted by the signal number count unit 137 becomes a certain number or more, the guard band control unit 138 sets the guard bands #1 and #2 that become the targets not to be determined in the boundaries of the zones #1, #2, and #3, with respect to the zone determination unit 131a. Further, the guard band control unit 138 controls the widths of the guard bands #1 and #2 based on the number of signals. For example, differently from the filter coefficient application control circuit in FIG. 4, the guard bands #1 and #2 are set according to the number of signals Sh' and Sv' having the power of the certain value or more even during communication and the widths of the guard bands #1 and #2 is also changed.

Figure 9:
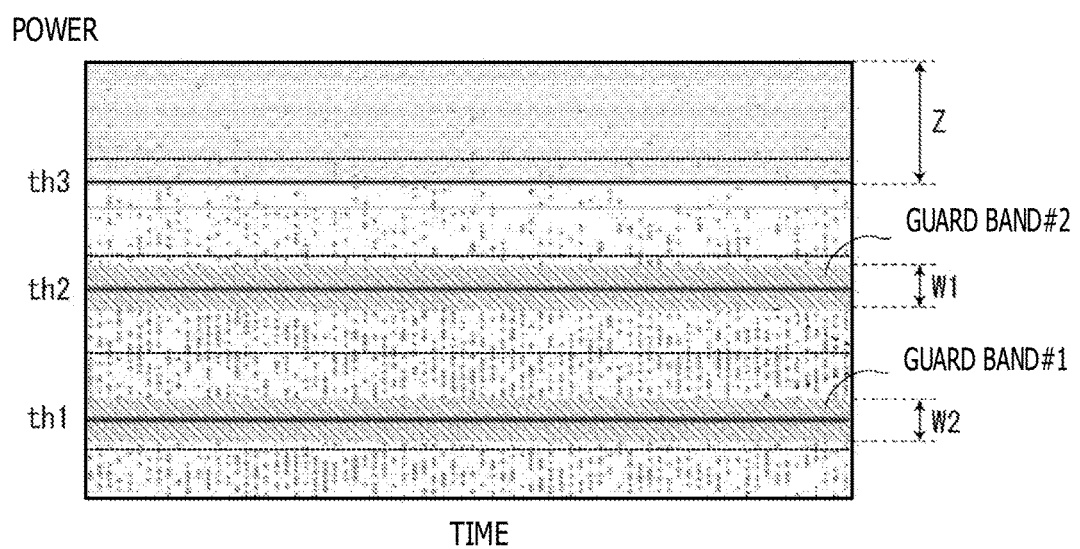
FIG. 9 illustrates still another example of a signal power distribution.

FIG. 9 illustrates still another example of a signal power distribution. In FIG. 9, a power distribution of the signals Sh' and Sv' to the time is represented for a case where the widths of the guard bands #1 and #2 are controlled. The signal number count unit 137 counts the number of signals having the power of the value th3 or more at regular periods and notifies the number of signals to the guard band control unit 138. For example, the signal number count unit 137 counts the number of signals having the power that belongs to the numerical range where the power is indicated by a reference symbol Z. The value th3 may be larger than the threshold values th1 and th2 of the boundaries between the zones #1, #2, and #3.

Since the power of the signals Sh' and Sv' is increased as the noise becomes larger, the number of signals belonging to the numerical range Z serves as an index of the magnitude of noise. Accordingly, the value th3 may be set based on a relationship between an optical signal-to-noise ratio (OSNR) and the number of signals.

Figure 10:
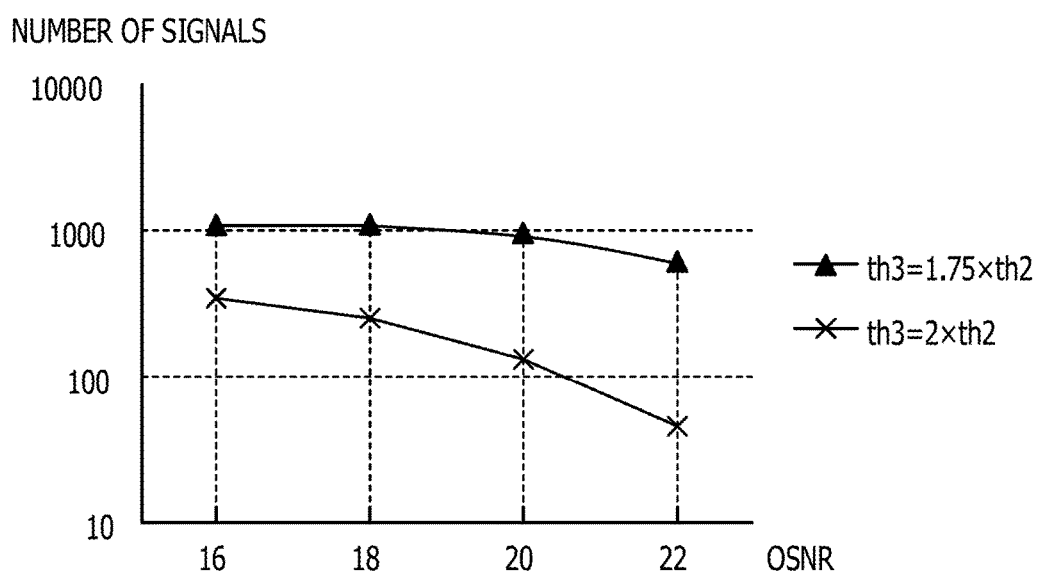
FIG. 10 illustrates an example of a variation in a number of signals with respect to an optical signal-to-noise ratio.

FIG. 10 illustrates an example of a variation in a number of signals with respect to an optical signal-to-noise ratio. In FIG. 10, the variation in the number of signals having the power of the value th3 or more to the OSNR is represented. In FIG. 10, a horizontal axis represents the OSNR, and a vertical axis represents the number of signals. In the calculation of the number of signals, it may be assumed that 16 QAM is used as a modulation scheme. Two types of values, for example, 2×th2 (see reference symbol "X") and 1.75×th2 (see reference symbol "▲") are used as the value th3.

As illustrated in FIG. 10, the variation in the number of signals to the OSNR in a case of "th3=2×th2" is larger than that in a case of "th3=1.75×th2". In the case of "th3=2×th2", the number of signals is significantly increased than that of a case of "th3=1.75×th2", as the OSNR becomes smaller, for example, as the noise becomes larger.

Accordingly, in the case of "th3=2×th2", the number of signals accurately indicates a noise state of the transmission line F. Therefore, the value th3 may be set as the "th3=2×th2."

The guard band control unit 138 sets the guard bands #1 and #2 when the number of signals becomes a certain number or more. The guard bands #1 and #2 may be set only when the magnitude of noise is a predetermined level or more. When the magnitude of noise is less than the certain level, the number of signals that becomes the targets not to be determined by the zone determination unit 131a may become zero.

The guard band control unit 138 controls the widths W1 and W2 of the guard bands #1 and #2 based on the number of signals. For example, the guard band control unit 138 expands the widths W1 and W2 of the guard bands #1 and #2 as the number of signals is increased, on the contrary, reduces the widths W1 and W2 of the guard bands #1 and #2 as the number of signals is decreased. Accordingly, the widths W1 and W2 of the guard bands #1 and #2 are adaptively increased or decreased according to the noise state of the transmission line F.

Figure 11:
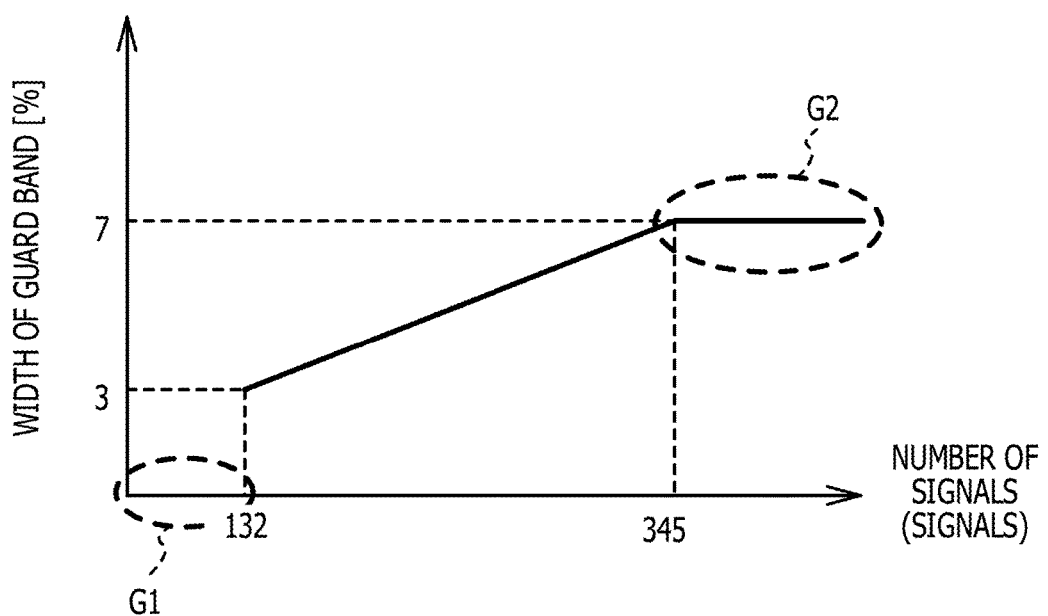
FIG. 11 illustrates an example of a width control of a guard band.

FIG. 11 illustrates an example of a width control of a guard band. In FIG. 11, the control of the widths W1 and W2 of the guard bands #1 and #2 is represented. In FIG. 11, the horizontal axis represents the number of signals counted by the signal number count unit 137, for example, represents the magnitude of noise, and the vertical axis represents the widths W1 and W2 of the guard bands #1 and #2. In the calculation of the widths W1 and W2 of the guard bands #1 and #2, it is assumed that 16 QAM is used as a modulation scheme, and the value of "th3=2×th2" is used. The widths W1 and W2 of the guard bands #1 and #2 are represented as a ratio (%) of the boundary value b of the zones #2 and #3 and the boundary value c of the zones #1 and #2, respectively.

For example, since the number of signals is set as the value of "th3=132 (signals)", when the number of signals is smaller than 132 (signals), the guard bands #1 and #2 are not set, as represented by the reference symbol G1. When the number of signals is within from 132 to 345 (signals), the widths W1 and W2 of the guard bands #1 and #2 are set to be proportional to the number of signals in a range from 3(%) to 7(%). The number of signals which is 132 (signals) may correspond to the OSNR of 20 (dB) and the number of signals which is 345 (signals) may correspond to the OSNR of 16 (dB).

For example, the guard band control unit 138 controls the widths W1 and W2 of the guard bands #1 and #2 to be proportional to the number of signals. Accordingly, the guard band control unit 138 may control the widths W1 and W2 of the guard bands #1 and #2 with a simple configuration.

When the number of signals exceeds 345 (signals), the guard bands #1 and #2 are set as 7(%), as represented by the reference symbol G2. For example, when the number of signals exceeds a upper limit number, the guard band control unit 138 controls the widths W1 and W2 of the guard bands #1 and #2 to be fixed to the certain value. For this reason, when the magnitude of noise is excessively large, the widths W1 and W2 of the guard bands #1 and #2 are fixed.

Accordingly, the increase of the number of signals that are the targets not to be determined accompanied by the increase of the power variation of signal may be reduced.

In the AEQ 1, the widths W1 and W2 of the guard bands #1 and #2 are increased or decreased according to the magnitude of noise. Accordingly, since the number of signals that become the targets not to be determined by the zone determination unit 131a is reduced, the calculation accuracy of the tap coefficients $\alpha 0$ to $\alpha n$ may be improved such that the performance of the FIR filters 11a to 11d is improved. The number of signals and the widths W1 and W2 of the guard bands #1 and #2 illustrated in FIG. 11 may be written in, for example, a table (e.g., a memory) within the guard band control unit 138 by being associated with each other, and the guard band control unit 138 may perform a control with reference to the table.

Figure 12:
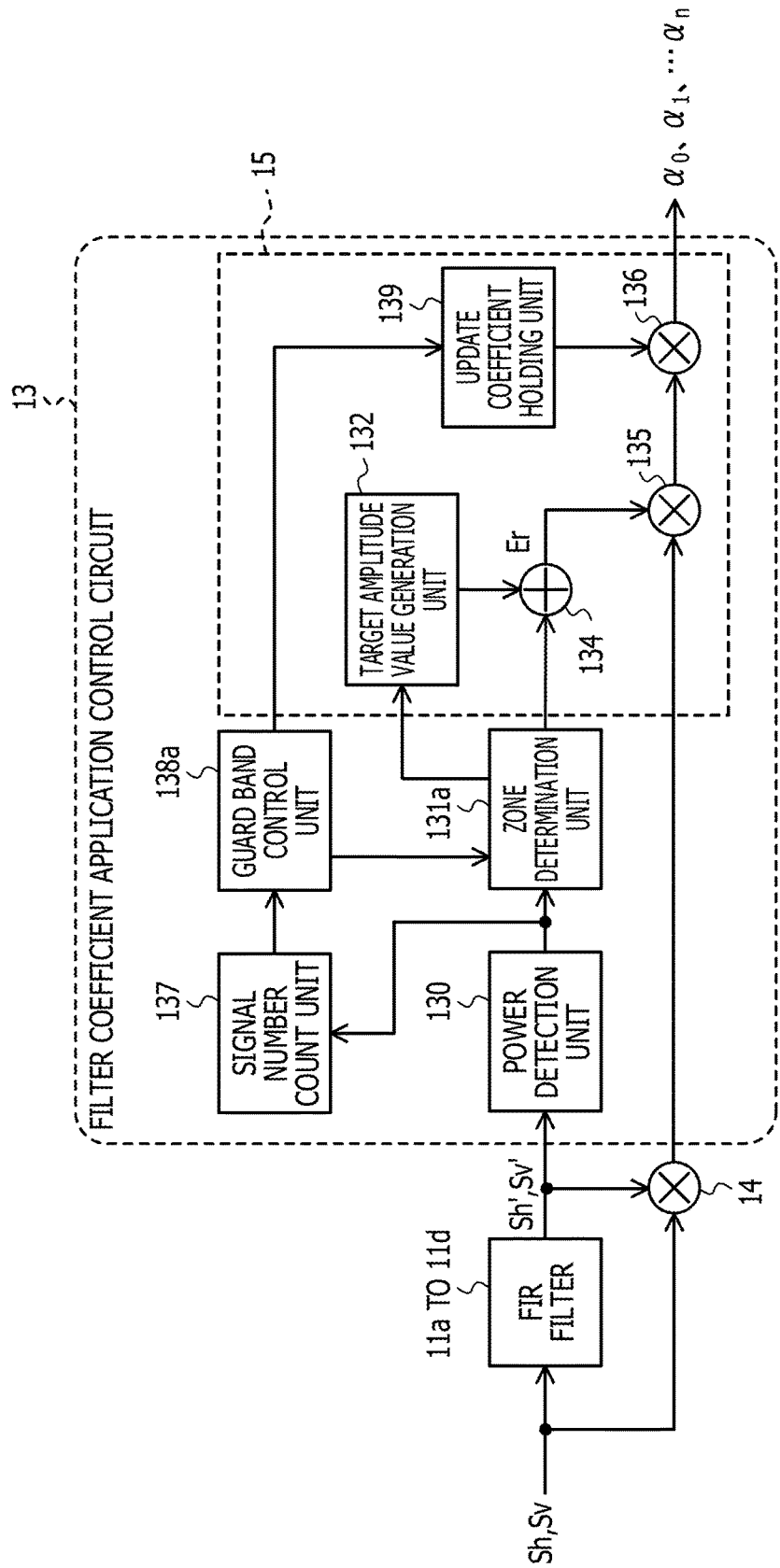
FIG. 12 illustrates another example of the filter coefficient application control circuit.

FIG. 12 is a diagram illustrating another example of a filter coefficient application control circuit. In FIG. 12, same reference numerals are given to the configuration which is substantially the same as or similar to that illustrated in FIG. 8, and descriptions thereof may be omitted or reduced.

The filter coefficient application control circuit 13 includes the power detection unit 130, the zone determination unit 131a, the target amplitude value generation unit 132, the adder 134, the multipliers 135, 136, an update coefficient generation unit 139, the signal number count unit 137, and a guard band control unit 138a. The filter coefficient application control circuit 13 may be a processor. The function of each unit of the processor may be executed by executing a program stored in, for example, a memory.

The guard band control unit 138a notifies the update coefficient generation unit 139 of the widths W1 and W2 of the guard bands #1 and #2, in addition to the operations performed by the guard band control unit 138 in FIG. 8. The update coefficient generation unit 139 generates the update coefficient based on the widths W1 and W2 of the guard bands #1 and #2.

For example, the guard band control unit 138a controls the update coefficient based on the widths W1 and W2 of the guard bands #1 and #2. The update unit 15 updates the tap coefficients $\alpha 0$ to $\alpha n$ with the variation amount according to the update coefficient. Accordingly, the tap coefficients $\alpha 0$ to $\alpha n$ are updated with an optimum value for the widths W1 and W2 of the guard bands #1 and #2.

Figure 13:
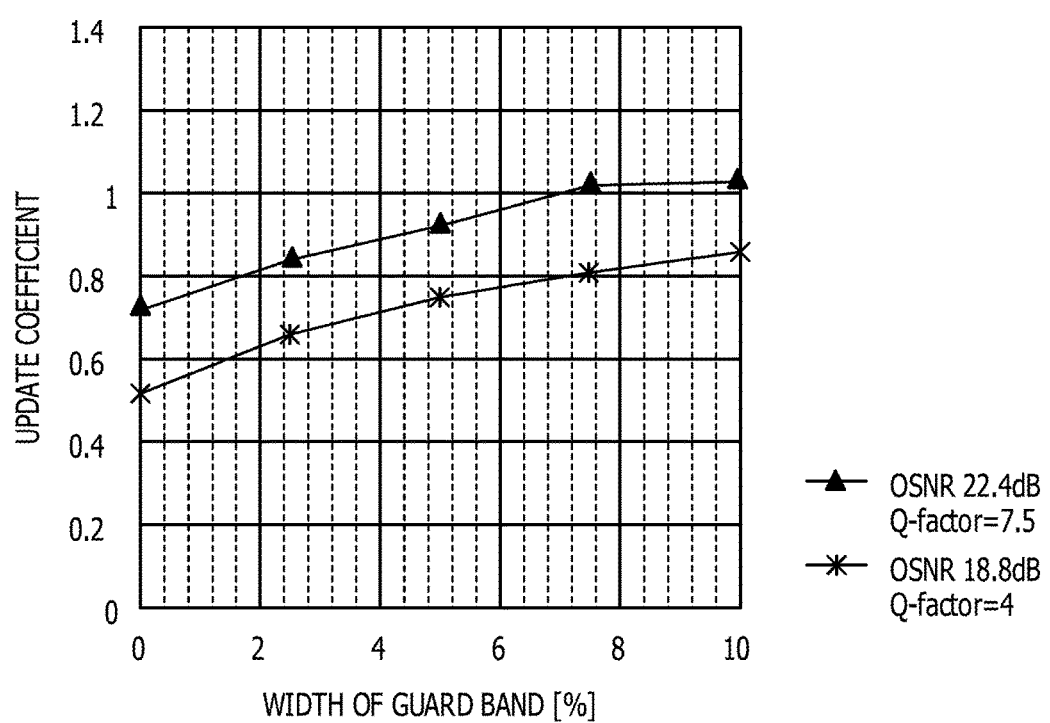
FIG. 13 illustrates an example of a control of an update coefficient.

FIG. 13 is a diagram illustrating an example of a control of an update coefficient. In FIG. 13, the horizontal axis represents the widths W1 and W2 of the guard bands #1 and #2 (%) and the vertical axis represents the update coefficient. For example, the update coefficients calculated for a case where the OSNR is 22.4 (dB) and Q value (Q-factor) is 7.5 (see reference symbol "▲"), and a case where the OSNR is 18.8 (dB) and Q value is 4 (see reference symbol "X") are represented.

The guard band control unit 138a is able to set a large update coefficient according to the widths W1 and W2 of the guard bands #1 and #2. For example, in case where the widths W1 and W2 of the guard bands #1 and #2 exceed 7(%), the update coefficient is set as about 1.0 when the OSNR is 22.4 (dB), and the update coefficient is set as a range from 0.8 to 0.9 when the OSNR is 18.8 (dB). The update coefficient and the widths W1 and W2 of the guard bands #1 and #2 illustrated in FIG. 13 may be written in, for example, a table (e.g. a memory) within the update coefficient generation unit 139 by being associated with each other, and the update coefficient generation unit 139 may determine the update coefficient with reference to the table.

In the AEQ 1, the update coefficient is controlled with an optimum value according to the widths W1 and W2 of the guard bands #1 and #2 and the calculation accuracy of the tap coefficients $\alpha 0$ to $\alpha n$ may be improved.

Figure 14:
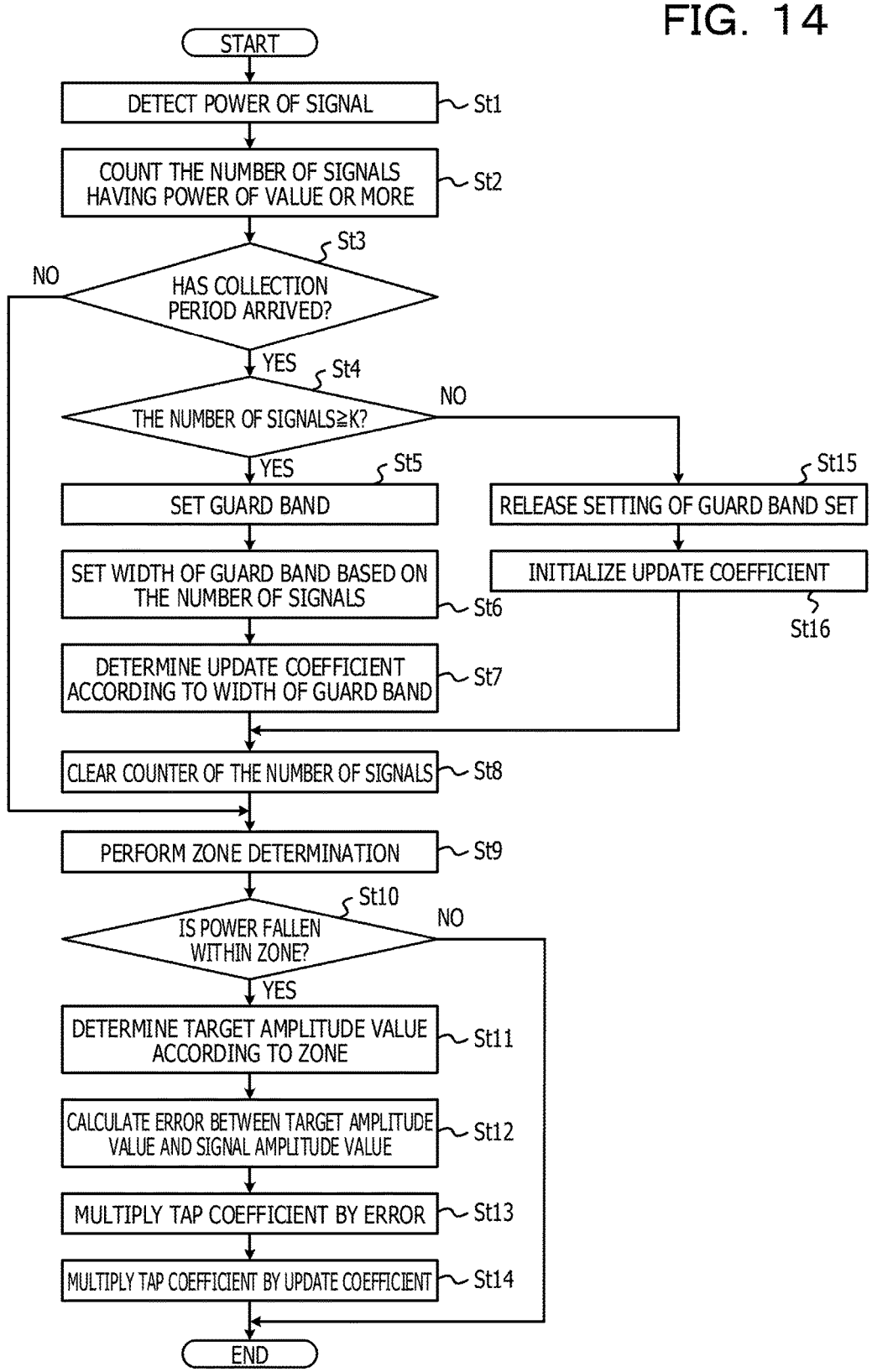
FIG. 14 illustrates an example of an operation of a adaptive equalizer.

FIG. 14 illustrates an example of an operation of an adaptive equalizer. The power detection unit 130 detects the power of the signals Sh' and Sv' output from the FIR filters 11a to 11d (Operation St1). The signal number count unit 137 counts the number of signals having the detected power of the value th3 or more (Operation St2).

The signal number count unit 137 determines whether a period has arrived at which the number of signals is collected (Operation St3). When it is determined that the period has not arrived ("NO" at Operation St3), a determination processing of the zones #1, #2, and #3 is performed (Operation St9).

When it is determined that the period has arrived ("YES" at Operation St3), the guard band control unit 138a determines whether the relationship of the number of signals ≥K (K is a positive integer) is satisfied (Operation St4). For example, the guard band control unit 138a determines whether the counted number of signals is a number K or more.

When it is determined that the relationship of the number of signals ≥K (K is a positive integer) is satisfied ("YES" at Operation St4), the guard band control unit 138a sets the guard bands #1 and #2 which become the targets not to be determined in the boundaries between the zones #1, #2, and #3, with respect to the zone determination unit 131a (Operation St5). The guard band control unit 138a sets the widths W1 and W2 of the guard bands #1 and #2 based on the number of signals (Operation St6). For example, the guard band control unit 138a controls the widths W1 and W2 of the guard bands #1 and #2 based on the number of signals.

The update coefficient generation unit 139 determines the update coefficient according to the set widths W1 and W2 of the guard bands #1 and #2 (Operation St7). For example, the guard band control unit 138a controls the update coefficient based on the widths W1 and W2 of the guard bands #1 and #2. In FIG. 8, since the update coefficient is a fixed value, the determination by the update coefficient generation unit 139 may not be performed. Thereafter, a clear processing of a counter may be performed at Operation St8.

When it is determined that the relationship of the number of signals <K is satisfied ("NO" at Operation St4), the guard band control unit 138a releases a setting of the guard bands #1 and #2 with respect to the zone determination unit 131a (Operation St15). The update coefficient generation unit 139 initializes the update coefficient (Operation St16).

The signal number count unit 137 clears the counter of the number of signals to zero (Operation St8). The zone determination unit 131a performs the processing of determining the zone based on the power detected by the power detection unit 130 (Operation St9). For example, the zone determination unit 131a determines one of the zones #1, #2, and #3 to which the detected power belongs.

When it is determined that the power does not belong to one of the zones #1, #2, and #3 ("NO" at Operation St10), for example, the power belongs to one of the guard bands #1 and #2, the zone determination unit 131a ends the process. When it is determined that the power belongs to one of the zones #1, #2, and #3 ("YES" at Operation St10), the target amplitude value generation unit 132 determines a target amplitude value according to the determination result of the zones #1, #2, and #3 (Operation St11).

The adder 134 calculates the error Er between the amplitude value of the signal input from the zone determination unit 131a and the target amplitude value (Operation St12). The multiplier 135 multiplies the current tap coefficients α0 to αn by the error Er (Operation St13). For example, the update unit 15 updates the tap coefficients α0 to αn of the FIR filters 11a to 11d according to the determination result of the zones #1, #2, and #3.

The multiplier 136 multiplies the tap coefficients α0 to αn output from the pre-stage multiplier 135 by the update coefficient input from the update coefficient generation unit 139 (Operation St14). In FIG. 8, the multiplier 136 multiplies the tap coefficients α0 to αn by the update coefficient having a fixed value input from the update coefficient holding unit 133. With the configuration as described above, the AEQ 1 operates.

Figure 15:
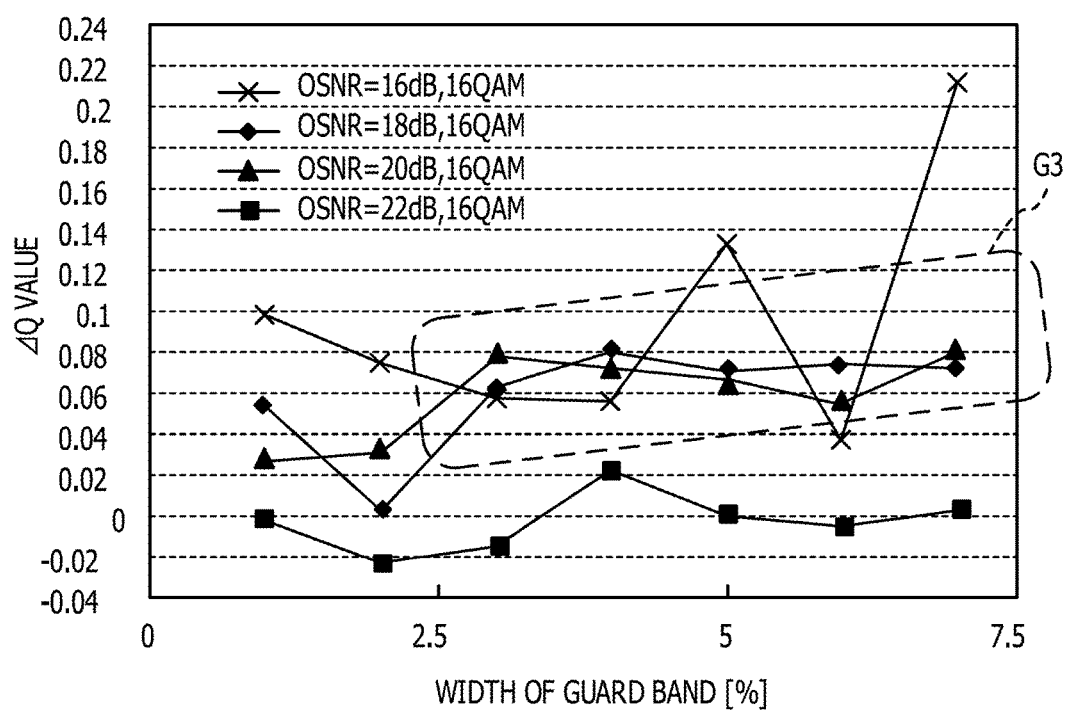
FIG. 15 illustrates an example of a change in Q values of a FIR filter with respect to a width of a guard band.

FIG. 15 illustrates an example of a change in Q values of a FIR filter to a width of guard band. In FIG. 15, a change in Q values of the FIR filters 11a to 11d with respect to the guard band widths W1 and W2 is represented. In FIG. 15, the horizontal axis represents the widths W1 and W2 (%) of the guard bands #1 and #2 and the vertical axis represents a difference (denoted by "ΔQ value") between the Q value and a Q value when the guard bands #1 and #2 are not set. When it is assumed that 16 QAM is used as a modulation scheme, ΔQ values calculated for a case where the OSNRs are 16 (dB), 18 (dB), 20 (dB), and 22 (dB) are represented. The ΔQ values corresponding to the values of the OSNRs may be distinguished from each other by reference symbols represented in the graph of FIG. 15.

When an area represented by the reference symbol G3 is referenced, the ΔQ value tends to increase according to the expansion of the widths W1 and W2 of the guard bands #1 and #2 as the OSNR becomes relatively smaller, for example, as the noise becomes larger. Accordingly, the guard bands #1 and #2 may be set so as to improve the performance of the FIR filters 11a to 11d.

In a case where the OSNR is large (e.g., 22 (dB)), for example, in a case where the noise is small, the ΔQ value stays in the vicinity of zero. For example, in a case where the noise is small, as illustrated in FIG. 6A, since the boundaries between the zones #1, #2, and #3 are clear, the guard bands #1 and #2 may not be set. Accordingly, the value th3 illustrated in FIG. 9 may be set as an appropriate value, such that the reduction of ΔQ value may be reduced when the guard bands #1 and #2 are not set for a case where the OSNR is large.

FIG. 16 illustrates an example of a Q value. In FIG. 16, the calculation results for the Q value of the FIR filter for each OSNR. When it is assumed that 16 QAM is used as a modulation scheme, the ΔQ values calculated for a case where the OSNRs are 16 (dB), 18 (dB), 20 (dB), and 22 (dB) are represented.

In FIG. 16, the Q values for a case where the guard bands #1 and #2 are not set (see, e.g., "guard band is absent"), a case where the guard bands #1 and #2 are not controlled as illustrated in FIG. 4 (see, e.g., "guard band control is absent"), and a case where the guard bands #1 and #2 are controlled as illustrated in FIG. 8 (see, e.g., "guard band control is present") are comparatively represented. The Q value for the case of the "guard band control is absent" is calculated by setting the widths W1 and W2 of the guard bands #1 and #2 as 5(%). The Q value for the case of the "guard band control is present" is calculated by setting the value th3 as 2×th2.

When a case where the noise is large, for example, the case where the OSNRs are 16 (dB), 18 (dB), and 20 (dB), respectively, is referenced, it is indicated that the Q value for the case of the "guard band control is present" is equal to or larger than the Q value for the cases of the "guard band is absent" and the "guard band control is absent." Accordingly, the performance of the FIR filters 11a to 11d may be improved by, for example, the AEQ 1 illustrated in FIG. 8 or FIG. 12.

When a case where the noise is small, for example, a case where the OSNR is 22 (dB) is referenced, it is indicated that the Q value for the case of the "guard band control is present" is substantially the same as the Q values for the cases of the "guard band is absent" and the "guard band control is absent." Accordingly, when the OSNR is large, the guard bands #1 and #2 may not be set.

The signal processing apparatus 1 includes the filters 11a to 11d, the detection unit 130, the determination unit 131a, the update unit 15, the count unit 137, and the control units 138 and 138a. The detect unit 130 detects the power of the signals Sh' and Sv' output from the filters 11a to 11d.

The determination unit 131a determines one of a plurality of numerical ranges to which the power detected by the detect unit 130 belongs. The update unit 15 updates the filter coefficients α0 to αn of the filters 11a to 11d according to the determination result by the determination unit 131a.

The count unit 137 counts the number of the signals Sh' and Sv' having the power value detected by the detect unit 130 of the value th3 or more. When the number of the signals Sh' and Sv' counted by the count unit 137 becomes the number K or more, the control units 138 and 138a set the invalid areas which become targets not to be determined in each of the boundaries of the plurality of numerical ranges with respect to the determination unit 131a, and control the widths W1 and W2 of the invalid areas based on the number of the signals Sh' and Sv'.

The filter coefficients 00 to an of the filters 11a to 11d are updated according to the determination result of the numerical range to which the power of the signals Sh' and Sv' belongs. Accordingly, the filter coefficients α0 to αn are updated so as to follow the variation of characteristics of the transmission line F for the signals Sh' and Sv'.

When the number of the signals Sh' and Sv' having the power of the value th3 or more becomes the number K or more, the control units 138 and 138a set the invalid areas which become the targets not to be determined in each of the boundaries of the plurality of numerical ranges. Accordingly, in a case where the magnitude of noise is a certain level or more, since the signals Sh' and Sv' having the power belonging to the invalid areas are not used for calculating the filter coefficients α0 to αn, the erroneous determination by the determination unit 131a may be reduced.

The control units 138, 138a control the widths W1 and W2 of the invalid areas based on the number of the signals Sh' and Sv' having the power of the value th3 or more. Accordingly, the widths W1 and W2 of the invalid areas are increased or decreased according to the magnitude of noise. Therefore, since the number of the signals Sh' and Sv' which become the targets not to be determined by the determination unit 131a is reduced, the calculation accuracy of the filter coefficients α0 to αn may be improved and the performance of the filters 11a to 11d may be improved.

The signal processing method may include the following operations. Operation (1): Detecting the power of the signals Sh' and Sv' output from the filters 11a to 11d. Operation (2): Determining one of a plurality of numerical ranges to which the detect power belongs. Operation (3): Updating the filter coefficients α0 to αn of the filters 11a to 11d according to a determination result. Operation (4): Counting the number of the signals Sh' and Sv' having the detected power of the value th3 or more. Operation (5): Setting an invalid area which becomes the targets not to be determined for a plurality of numerical ranges in the each of boundaries between the plurality of numerical ranges when the counted number of the signals Sh' and Sv' becomes a number K or more. Operation (6): Controlling the width of the invalid area based on the number of signals Sh' and Sv'.

The signal processing method described above may obtain a similar effect to that of the signal processing apparatus described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A signal processing apparatus comprising:
    a filter; and
    a filter control circuit,
    wherein the filter control circuit is configured to:
    detect a power of signals output from the filter;
    determine one of a plurality of numerical ranges to which the power belongs;
    update a filter coefficient of the filter according to a determination result;
    count a number of the signals having the power of a first value or more;
    set an invalid area which becomes a target not to be determined for each of one or more boundaries between the plurality of numerical ranges when the number of the signals becomes a second value or more; and
    control a width of the invalid area based on the number of signals.

2. The signal processing apparatus according to claim 1, wherein the filter control circuit is configured to control the width of the invalid area so as to be proportional to the number of the signals.

3. The signal processing apparatus according to claim 1, wherein the filter control circuit is configured to control the width of the invalid area so as to become a fixed width when the number of the signals exceeds a third value.

4. The signal processing apparatus according to claim 1, wherein the filter control circuit is configured to update the filter coefficient with a variation amount according to an update coefficient.

5. The signal processing apparatus according to claim 1, wherein the filter control circuit is configured to control an update coefficient corresponding to a variation amount for an update according to the width of the invalid area.

6. The signal processing apparatus according to claim 1, wherein the filter control circuit is configured to not set the invalid area when the number of the signals is less than the second value.

7. A signal processing method comprising:
    detecting a power of signals output from a filter;
    determining one of a plurality of numerical ranges to which the power belongs;
    updating a filter coefficient of the filter according to a determination result;
    counting a number of the signals having the power of a first value or more;
    setting an invalid area which becomes a target not to be determined for each of one or more boundaries between the plurality of numerical ranges when the number of the signals becomes a second value or more; and
    controlling a width of the invalid area based on the number of signals.

8. The signal processing method according to claim 7, wherein the width of the invalid area is controlled so as to be proportional to the number of the signals.

9. The signal processing method according to claim 7, wherein the width of the invalid area is controlled so as to become a fixed width when the number of the signals exceeds a third value.

10. The signal processing method according to claim 7, wherein the filter coefficient is updated with a variation amount according to an update coefficient.

11. The signal processing method according to claim 7, wherein an update coefficient corresponding to a variation amount for an update is controlled according to the width of the invalid area.

12. The signal processing method according to claim 7, wherein the invalid area is not set when the number of the signals is less than the second value.

13. A signal processing system comprising:
    a filter;
    a processor configured to control the filter based on a program,
    wherein the processor is configured to:
    detect a power of signals output from the filter;
    determine one of a plurality of numerical ranges to which the power belongs;
    update a filter coefficient of the filter according to a determination result;
    count a number of the signals having the power of a first value or more;
    set an invalid area which becomes a target not to be determined for each of one or more boundaries between the plurality of numerical ranges when the number of the signals becomes a second value or more; and
    control a width of the invalid area based on the number of signals.

14. The signal processing system according to claim 13, wherein the processor is configured to control the width of the invalid area so as to be proportional to the number of the signals.

15. The signal processing system according to claim 13, wherein the processor is configured to control the width of the invalid area so as to become a fixed width when the number of the signals exceeds a third value.

16. The signal processing system according to claim 13, wherein the processor is configured to update the filter coefficient with a variation amount according to an update coefficient.

17. The signal processing system according to claim 13, wherein the processor is configured to control an update coefficient corresponding to a variation amount for an update according to the width of the invalid area.

18. The signal processing system according to claim 13, wherein the processor is configured to not set the invalid area when the number of the signals is less than the second value.

* * * * *